US010366033B2

(12) United States Patent  
Alley et al.

(10) Patent No.: US 10,366,033 B2  
(45) Date of Patent: Jul. 30, 2019

(54) AUTOMATED RETROFIT INSTALLATION TOOL FOR REPLACEMENT OF ONE OR MORE PRE-EXISTING DEDICATED INPUT/OUTPUT (I/O) MODULES AND TERMINAL BOARDS WITH ONE OR MORE UNIVERSAL I/O MODULES

(71) Applicant: General Electric Company, Schenectady, NY (US)

(72) Inventors: Daniel Milton Alley, Salem, VA (US); Roy Anthony Carter, Salem, VA (US); Joshua Sherman, Salem, VA (US)

(73) Assignee: General Electric Company, Schenectady, NY (US)

( * ) Notice: Subject to any disclaimer, the term of this patent is extended or adjusted under 35 U.S.C. 154(b) by 212 days.

(21) Appl. No.: 15/266,447

(22) Filed: Sep. 15, 2016

(65) Prior Publication Data

US 2018/0074987 A1 Mar. 15, 2018

(51) Int. Cl.
*G06F 13/38* (2006.01)
*H05K 5/02* (2006.01)
*G06F 13/40* (2006.01)
*G06F 13/42* (2006.01)
(Continued)

(52) U.S. Cl.
CPC ..... *G06F 13/4022* (2013.01); *G05B 19/0423* (2013.01); *G05B 19/054* (2013.01); *G06F 13/382* (2013.01); *G06F 13/385* (2013.01); *G06F 13/4282* (2013.01); *H05K 5/026* (2013.01); *G05B 2219/21087* (2013.01); *G05B 2219/2243* (2013.01); *G05B 2219/25061* (2013.01); *G05B 2219/25074* (2013.01); *G05B 2219/25428* (2013.01);
(Continued)

(58) Field of Classification Search
CPC .............................. G06F 13/385; H05K 5/026
USPC ................ 710/2, 10–11, 14, 16, 62–63, 100, 710/301–302
See application file for complete search history.

(56) References Cited

U.S. PATENT DOCUMENTS

| 6,301,612 B1 | 10/2001 | Selitrennikoff et al. |
| 6,424,959 B1 * | 7/2002 | Bennett, III .......... G06F 17/505 706/13 |
| 7,451,606 B2 | 11/2008 | Harrod et al. |

(Continued)

*Primary Examiner* — Farley Abad  
*Assistant Examiner* — Henry W Yu  
(74) *Attorney, Agent, or Firm* — Armstrong Teasdale LLP (57) ABSTRACT

Described are systems, methods and computer-program product for replacing a prior input/output (I/O) module and terminal board with a universal I/O device by providing software based instructions and configuration settings for the installer. The method includes provisions for new wiring changes or harnesses as well as preset adapters, converting prior device configuration settings from an I/O module, pack, and/or terminal board to new configuration settings for a programmable I/O device, generating a wiring chart for any wiring changes based on the settings, and displaying the information for the installer and/or programmer's use. This allows a universal I/O device capable of each channel having different operating modes to replace one or more of a mixture of several types of dedicated I/O modules. The installation documentation and configurations are automatically generated, reducing the chance of errors due to misinterpretation of multiple product documents while allowing the automatic transfer of product settings.

20 Claims, 4 Drawing Sheets

(51) Int. Cl.
    *G05B 19/042*     (2006.01)
    *G05B 19/05*      (2006.01)

(52) U.S. Cl.
    CPC .............. *G05B 2219/25454* (2013.01); *G05B 2219/31121* (2013.01); *G05B 2219/33331* (2013.01)

(56) References Cited

U.S. PATENT DOCUMENTS

| | | |
|---|---|---|
| 7,577,948 B2 | 8/2009 | Zomaya et al. |
| 7,908,467 B2 | 3/2011 | Philyaw et al. |
| 8,010,999 B2 | 8/2011 | Fujita et al. |
| 8,341,251 B2 * | 12/2012 | Gao .................... H04L 67/1097 709/220 |
| 8,635,313 B2 | 1/2014 | Roberts et al. |
| 8,670,859 B2 | 3/2014 | Hrachovec et al. |
| 8,700,828 B2 * | 4/2014 | Harish .................. G06F 13/385 710/63 |
| 8,924,600 B2 * | 12/2014 | Alley ..................... G06F 13/385 710/12 |
| 8,935,646 B2 * | 1/2015 | Whitford .............. G06F 17/509 716/119 |
| 2003/0093598 A1 * | 5/2003 | Park ................... H04M 1/72527 710/63 |
| 2003/0172198 A1 * | 9/2003 | Tiwary ................ G06F 11/3414 710/1 |
| 2004/0268077 A1 * | 12/2004 | Floman ................. G06F 13/385 711/170 |
| 2005/0125578 A1 * | 6/2005 | Liao ..................... H04B 1/0003 710/100 |
| 2008/0307143 A1 * | 12/2008 | Lin ....................... G06F 13/385 710/302 |
| 2011/0231584 A1 * | 9/2011 | Ishihara ................. H04L 12/12 710/16 |
| 2013/0282925 A1 * | 10/2013 | Cawse .................. G06F 13/385 710/2 |
| 2014/0239923 A1 * | 8/2014 | Alley ...................... G05B 9/03 323/234 |

\* cited by examiner

AUTOMATED RETROFIT INSTALLATION TOOL FOR REPLACEMENT OF ONE OR MORE PRE-EXISTING DEDICATED INPUT/OUTPUT (I/O) MODULES AND TERMINAL BOARDS WITH ONE OR MORE UNIVERSAL I/O MODULES

TECHNICAL FIELD

Aspects of the disclosure relate generally to an improvement in technology utilizing a computer aided system and method to facilitate the replacement of dedicated I/O modules (which includes modules, packs, and/or terminal boards) with universal I/O devices having multiple channels where each channel can be programmed to have different operating modes (e.g., capable of each channel having different operating modes (e.g., RTD, TC, mA I/O, communications, analog I/O and digital I/O).

BACKGROUND

Generally, sensor-based industrial control systems (ICS) comprise sensors that measure and/or monitor various parameters (e.g., temperature, flow rate, valve position, voltage, current, etc.) of a process. The sensors receive and/or provide signals to an input/output device, which is in communication with one or more processors. In the past, these input/output devices have been dedicated devices, which means that one I/O module is required for digital I/O, another for analog I/O, another for connecting with resistance temperature detectors (RTDs), and the like. However, recently universal I/O modules have been developed that have a plurality of channels, with each channel capable of being programmed for interacting with a different type of sensor. For example, one universal I/O module having a plurality of channels can interface with sensors that send/receive digital I/O, analog I/O, RTD I/O, communication I/O, and the like. Such a universal I/O module is described in at U.S. Pat. No. 8,924,600 issued to Alley at al. on Dec. 30, 2015, which is fully incorporated by reference and made a part hereof.

Prior replacement designs for packs and terminal boards have maintained direct swap out, where the terminal locations and configuration files are not altered. For universal I/O products, replacing multiple prior products (e.g. RTD, TC, mA IO, Hart IO, and 24V Digital In), this is not possible. The user wiring connections (and even quantity of screw terminals) on the prior modules differ among the various terminal boards. Forming the new wiring table for the installer takes time reviewing documentation by engineering. Configuration settings also differ between the prior modules—forcing an installer to use software tools such as ToolboxST™ (General Electric Company, Schenectady, N.Y.) to somehow transfer all of the settings to the replacement universal I/O device.

Therefore, systems, methods and computer program products are desired that overcome challenges in the art, some of which are described above.

SUMMARY

Disclosed herein is a software tool to aid an installer to access all appropriate information prepared for just the conversion underway—greatly reducing the amount of documentation errors while allowing for automatic transfer of the configuration settings to speed up any software changes due to the replacement. Variations on the methods described herein include options for wiring harnesses or adapters to eliminate shifting wires on removable terminal blocks.

In one aspect, a method for facilitating the replacement of one or more pre-existing dedicated input/output (I/O) modules and terminal boards with one or more universal I/O modules is disclosed. The one or more pre-existing dedicated I/O modules may comprise one or more thermocouple (TC) modules, resistance temperature detector (RTD) modules, analog I/O modules, digital I/O modules, communication modules, and the like. The disclosed method comprises obtaining information about the one or more pre-existing dedicated I/O modules and terminal boards, wherein the information includes at least one or more functions of the more pre-existing dedicated I/O modules and terminal boards; determining the one or more functions of the more pre-existing dedicated I/O modules and terminal boards that can be performed by the one or more universal I/O modules; determining any gaps between the one or more functions of the more pre-existing dedicated I/O modules and terminal boards and the functions that can be performed by the one or more universal I/O modules; and providing instructions for replacement of one or more pre-existing dedicated input/output (I/O) modules and terminal boards with one or more universal I/O modules, wherein the instructions include the gaps between the one or more functions of the more pre-existing dedicated I/O modules and terminal boards and the functions that can be performed by the one or more universal I/O modules.

Alternatively or optionally, obtaining information about the one or more pre-existing dedicated I/O modules and terminal boards comprises receiving, by a computer system, the information. For example, the computer system may receive the information as information input by use of a keyboard, barcode scanner, or received as image information from an image capture device.

Alternatively or optionally, obtaining information about the one or more pre-existing dedicated I/O modules and terminal boards may comprise performing a database lookup for the information based on receiving, by a computer system, identification information that identifies the one or more pre-existing dedicated I/O modules and terminal boards.

Alternatively or optionally, determining the one or more functions of the more pre-existing dedicated I/O modules and terminal boards that can be performed by the one or more universal I/O modules may comprise determining a number of channels of thermocouple (TC) I/O, resistance temperature detector (RTD) I/O, analog I/O, digital I/O, and communication I/O on the pre-existing dedicated input/output (I/O) modules that will be replaced by the one or more universal I/O modules.

Alternatively or optionally, providing instructions for replacement of one or more pre-existing dedicated input/output (I/O) modules and terminal boards with one or more universal I/O modules may comprise preparing a report of spare channels on the one or more universal I/O modules, creating wiring diagrams for wiring in the one or more universal I/O modules, and creating configuration files and software settings for software that interfaces with the one or more universal I/O modules.

Alternatively or optionally, providing instructions for replacement of one or more pre-existing dedicated input/output (I/O) modules and terminal boards with one or more universal I/O modules may comprise specifying a wiring harness, connectors and wiring instructions for connecting the existing dedicated input/output (I/O) modules with the one or more universal I/O modules with the wiring harness and one or more connectors.

Alternatively or optionally, the method may further comprise displaying the instructions for replacement of one or more pre-existing dedicated input/output (I/O) modules and terminal boards with one or more universal I/O modules.

In another aspect, an alternate method for facilitating the replacement of one or more pre-existing dedicated input/output (I/O) modules and terminal boards with one or more universal I/O modules is disclosed. This disclosed method comprises obtaining information about the one or more pre-existing dedicated I/O modules and terminal boards, wherein the information includes at least one or more functions of the more pre-existing dedicated I/O modules and terminal boards; determining the one or more functions of the more pre-existing dedicated I/O modules and terminal boards that can be performed by the one or more universal I/O modules; and if the one or more functions of the more pre-existing dedicated I/O modules and terminal boards can be performed by the one or more universal I/O modules, then either: preparing a report of spare channels on the one or more universal I/O modules, creating wiring diagrams for wiring in the one or more universal I/O modules, and creating configuration files and software settings for software that interfaces with the one or more universal I/O modules; or specifying a wiring harness, connectors and wiring instructions for connecting the existing dedicated input/output (I/O) modules with the one or more universal I/O modules with the wiring harness and one or more connectors.

If the one or more functions of the more pre-existing dedicated I/O modules and terminal boards cannot be performed by the one or more universal I/O modules, then: determining any gaps between the one or more functions of the more pre-existing dedicated I/O modules and terminal boards and the functions that can be performed by the one or more universal I/O modules and reporting the gaps; and preparing a report of spare channels on the one or more universal I/O modules, creating wiring diagrams for wiring in the one or more universal I/O modules, and creating configuration files and software settings for software that interfaces with the one or more universal I/O modules, wherein the report identifies the gaps.

In yet another aspect, a non-transitory computer-readable medium with computer-executable instructions thereon is disclosed. The computer readable instructions for performing a method for facilitating the replacement of one or more pre-existing dedicated input/output (I/O) modules and terminal boards with one or more universal I/O modules comprise obtaining information about the one or more pre-existing dedicated I/O modules and terminal boards, wherein the information includes at least one or more functions of the more pre-existing dedicated I/O modules and terminal boards; determining the one or more functions of the more pre-existing dedicated I/O modules and terminal boards that can be performed by the one or more universal I/O modules; determining any gaps between the one or more functions of the more pre-existing dedicated I/O modules and terminal boards and the functions that can be performed by the one or more universal I/O modules; and providing instructions for replacement of one or more pre-existing dedicated input/output (I/O) modules and terminal boards with one or more universal I/O modules, wherein the instructions include the gaps between the one or more functions of the more pre-existing dedicated I/O modules and terminal boards and the functions that can be performed by the one or more universal I/O modules.

Alternatively or optionally, providing instructions for replacement of one or more pre-existing dedicated input/output (I/O) modules and terminal boards with one or more universal I/O modules may comprise specifying a wiring harness, connectors and wiring instructions for connecting the existing dedicated input/output (I/O) modules with the one or more universal I/O modules with the wiring harness and one or more connectors.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices. Furthermore, all or portions of aspects of the disclosed can be implemented using cloud-based processing and storage systems and capabilities. One such non-limiting example of a cloud-base service that can be used in implementations of the disclosed is GE Predix™, as available from the General Electric Company (Schenectady, N.Y.). Predix™ is a cloud-based PaaS (platform as a service) that enables industrial-scale analytics for asset performance management (APM) and operations optimization by providing a standard way to connect machines, data, and people.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Replacing dedicated I/O devices such as those for connecting RTD in, T/C in, mA out, and 24V DI terminal boards with universal I/O devices can be complicated by several factors including variations based on excitation and number of wires per channel. The number of connections and the variations on mA/V I/O (due to external/internal power and jumper locations on the replaced dedicated device) begs for user errors. Further, the numbering of the terminal blocks alternates so a picture of the "from" and "to" blocks is desired even as the size of blocks differs. Generally, a universal I/O device will comprise 16 channels, so if the number of channels used is less than the 16 on the universal I/O device, the extra channels are left for spares. These issues create a need for an improvement in technology to facilitate the replacement of one or more pre-existing dedicated input/output (I/O) modules and terminal boards with one or more universal I/O modules.

Figure 1:
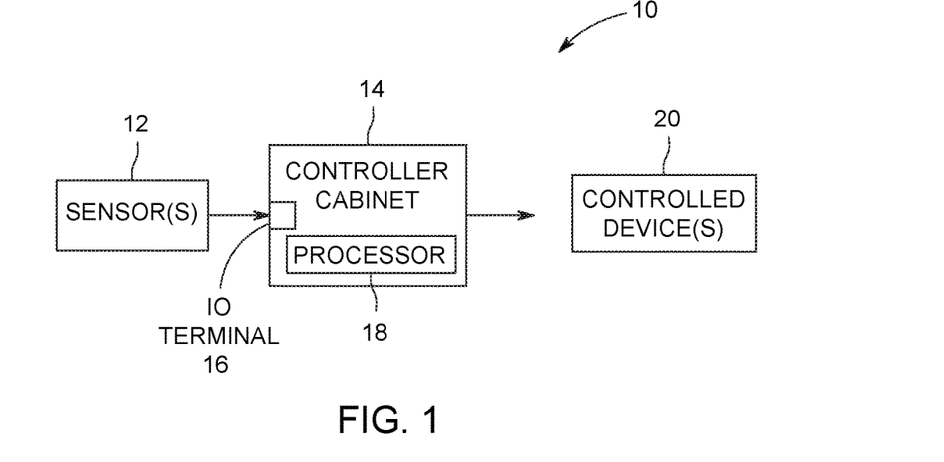
FIG. 1 is an overview illustration of a basic sensor-controlled control system.

FIG. 1 is an overview illustration of a very basic sensor-controlled control system 10. In some embodiments, the sensor-controlled system 10 may be a power management system in a power plant or other suitable systems. In certain embodiments, the sensor-controlled system 10 includes one or more sensors 12 that couple to a controller cabinet 14 through one or more I/O terminals 16. As used herein, the terms "I/O terminals," "I/O devices," "I/O modules" and "I/O packs" are used interchangeably. In certain embodiments, the one or more sensors 12 may detect temperatures (e.g., thermocouples, resistor temperature detectors (RTDs)), electrical properties (e.g., current, voltage) of certain signals, or other suitable properties and may transmit sensed information to a respective 10 terminal 16 in one of a variety of formats. For example, various embodiments of the terminals 16 may receive information from various types of sensors 12 that send information using various voltages, such as 2.5 to 5V, −10V to 10 V, 30 mV to 10V, −100 mV to 100 mV, or other suitable voltages. Additionally, or alternatively, some embodiments of the I/O terminals 16 may receive signals from the sensors 12 using a variety of currents such as 4-20 mA, 10 mA, or other suitable currents. Additionally, certain embodiments of the sensors 12 may transmit using a highway addressable remote transducer (HART) protocol or other similar protocols.

In some embodiments, the controller cabinet 14 may be housed in a single physical enclosure (e.g., a personal computer, server, or other suitable controller system) or may include multiple enclosures (e.g., distributed control system). In each of the various embodiments, the one or more I/O terminals 16 provide a connection between the one or more sensors 12 and the controller cabinet 14. As discussed in detail below, the one or more I/O terminals 16 provide a link between the sensor 16 and a processor 18. In some embodiments, the processor 18 may include a microcontroller, a microprocessor, a programmable logic controller (PLC), or another suitable processor. Accordingly, through the one or more I/O terminals 16, the processor 18 may receive signals from the one or more sensors 12 that sense various measurements within the sensor-controlled system 10. Additionally, the one or more I/O terminals 16 may be grouped in channels to receive sensed parameters from the one or more sensors 12 through more than one I/O terminal. Furthermore, one or more of the I/O terminals 16 in a channel may be used to return information to one or more sensors 12. For example, in some embodiments, a sensor 12 (e.g., RTD) may be connected to the controller cabinet 14 through one, two, three, four, or more I/O terminals 16. For example, in certain embodiments, one channel may encompass 2 I/O terminals 16, but other embodiments may include channels encompassing three, four, or more I/O terminals 16. Moreover, in some embodiments each sensor 12 may connect to a single channel, but other embodiments may include sensors 12 that span two or more channels.

In various embodiments, once the processor 18 has received a sensed parameter (e.g., temperature) from the one or more sensors 12, the processor 18 may use this sensed parameter to control one or more controlled devices 20 and/or select a sensor type for the connected sensor 12. Within the sensor-controlled system 10, the controlled devices 20 may include any device that depends upon or creates the measurements from the one or more sensors 12. For example, in certain embodiments, the controlled devices 20 may include one or more devices within a power plant (e.g., compressor, combustor, turbine, etc.).

Figure 2:
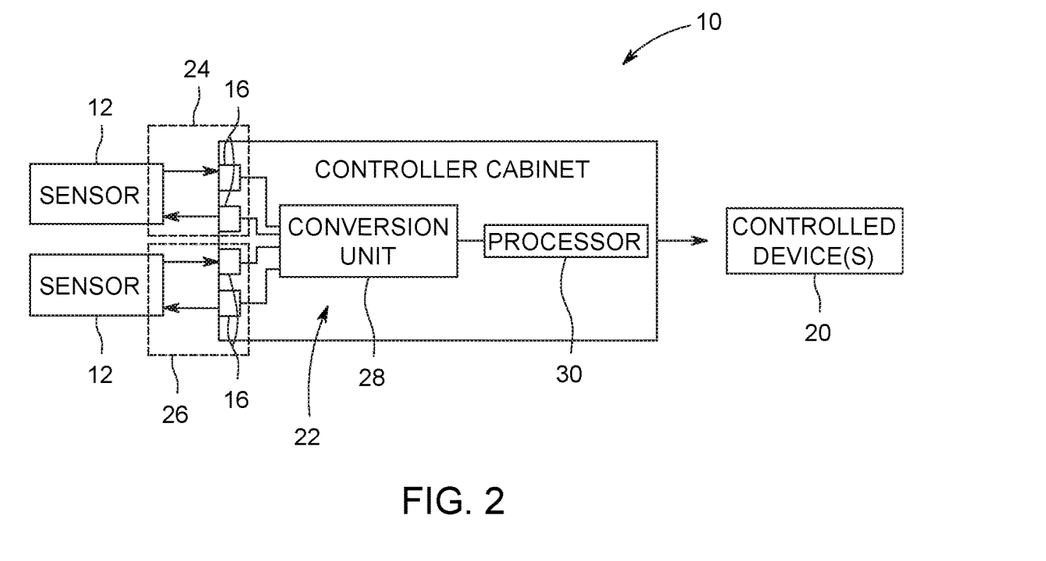
FIG. 2 illustrates a sensor-controlled system that includes a sensor conversion system.

As can be appreciated, signals from the one or more sensors 12 may contain voltages and/or currents that the processor 18 may not be able to receive directly from the one or more sensors 12 without first converting those signals to a new voltage and/or current. Accordingly, FIG. 2 illustrates a sensor-controlled system 10 includes a sensor conversion system 22. In the illustrated embodiment, the sensor-controlled system 10 includes two sensors 12, but other embodiments may include one, three, four, or more sensors. Additionally, the illustrated embodiment of the sensor-controlled system 10 includes a first channel 24 that couples the controller cabinet 14 to a respective sensor 12. The illustrated embodiment of the sensor-controlled system 10 also includes a second channel 26 that couples the controller cabinet 14 to a respective sensor 12. Although the illustrated embodiment of the first channel 24 and the second channel 26 each includes two I/O terminals 16 each, certain embodiments of the sensor conversion system 22 include channels having one, three, four, or more I/O terminals 16. The illustrated embodiment of the sensor conversion system 22 also includes a conversion component 28 the converts the signals from the sensor(s) 12 to voltages and/or currents that are suitable for processing by the processor 18. As discussed in detail below, the conversion component 28 may receive inputs from one or more sensors 12 regardless of a sensor type of each respective sensor 12. The conversion component 28 then converts the signals from each of the sensors 12 regardless of sensor type to signals suitable for the processor 18 to process. For example, the sensors 12 may be any sensor type, such as sensors 12 that send 4-20 milliamp signals, thermocouples, RTDs, HART devices, or other suitable sensor types. In other words, the conversion component 28 (along with the I/O terminals 16) provides a universal I/O point that enables the use of various sensor types to connect to the controller cabinet 14 and the processor 18 without implementing dedicated I/O terminals 16 for each sensor type. By increasing versatility of the I/O terminals 16 in the controller cabinet 14, production and design costs of the controller cabinet 14 is reduced by providing a single controller cabinet 14 that may couple to various sensors 12 and/or sensor types, thereby enabling the controller cabinet 14 to be used in a variety of settings without redesigning the controller cabinet 14 for each intended use or wasting additional dedicated I/O terminals 16.

In some embodiments, the conversion component 28 may include voltage and/or current conversion circuitry that may be implemented using application specific integrated circuits (ASICs) or other suitable circuitry. Additionally, in some embodiments, the conversion component 28 may include further processing circuitry that may perform additional manipulation on the sensed signals from the sensor(s) 12. For example certain embodiments of the conversion component 28 may include digital-to-analog converters (DAC) and/or analog-to-digital converters (ADC).

Figure 3:
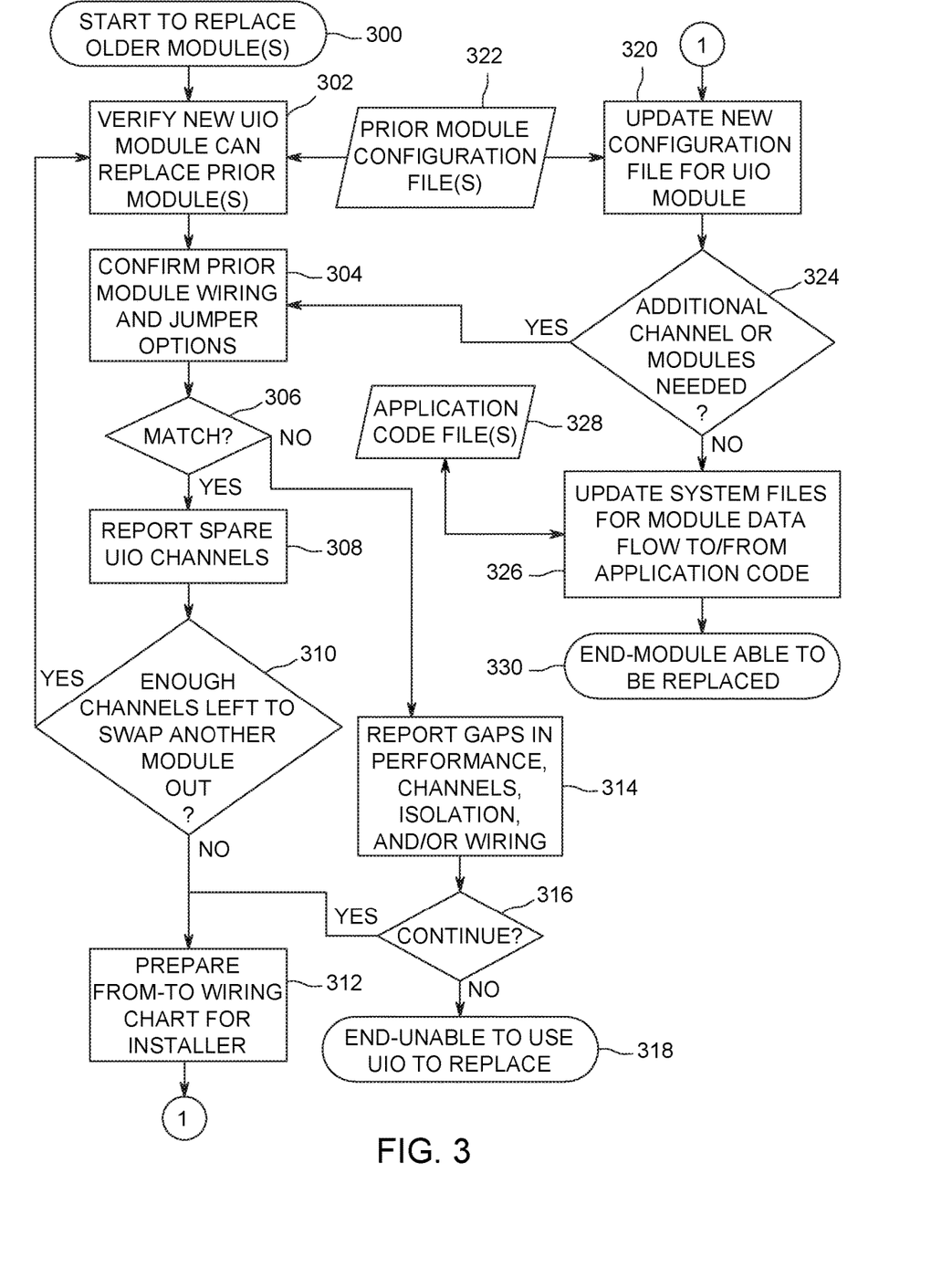
FIG. 3 shows a flowchart of an embodiment of a software tool, where a user can access operations to facilitate the replacement of one or more pre-existing dedicated input/output (I/O) modules and terminal boards with one or more universal I/O modules.

FIG. 3 shows a flowchart of an embodiment of a software tool, where a user can access these operations from an edge device/application such as Field Agent™ (General Electric Company, Schenectady, N.Y.), deployed to the a cloud-based platform (e.g., Predix) and accessed from there if the site has internet access (for security and access to internal files and data), or from a new separate tool (e.g., GE's Virtual Field Agent™) running on a laptop or other computing device. The user first answers a few questions (e.g. what is replaced at what location in the which cabinet, if for an existing analog I/O module, then which jumpers and user wire connections are used), followed by the tool checking if the (new) universal I/O module is capable of performing the task (e.g. if an existing 24 channel digital I/O module is replaced with more than 16 channels in use).

If the pre-existing module can be replaced, a report of spare channels (if any) and a wiring chart is prepared. The disclosed tool then uses the prior configuration file to generate an updated configuration for use in configuration software for the universal I/O module (e.g., ToolboxST™). The application code that is used to interface the control system with the universal I/O module may then be updated for the module information, along with any warnings for parameters needing input where the universal I/O module may have additional settings.

If the pre-existing I/O module cannot be directly replaced as-is, the tool reports the gaps. These may be performance (e.g. specification changes), lack of enough channels (requiring additional passes for extra universal I/O devices), isolation (e.g. point products cannot be directly replaced with group isolated products), wiring, and the like. The use can confirm if the replacement is continued or halted to leave the settings as-is. If continued, wiring charts, configuration files, and application files are updated with the gaps identified. The tool may loop if needed to add an additional module to cover the additional channels. The installer may then use the wiring charts to alter wiring as needed then power the system up with configuration software (such as the ToolboxST™ application) to download the changes in configuration and application.

Specifically, in reference to FIG. 3, at 300, the process begins. At 302, it is determined whether one or more universal I/O modules can be used to replace the pre-existing dedicated I/O modules. The determination involves 304 confirming wiring and jumper options for the pre-existing module and seeing if they match 306 wiring and jumper options for the replacement universal I/O modules. If, at 306, the wiring and jumper options for the pre-existing dedicated module and the new universal I/O module match, then at 308 a report is generated that shows the connections to the new universal I/O module and list any spare channels available on the universal I/O module. At 310, it is determined whether there are enough spare I/O channels available on the universal I/O module to replace another pre-existing dedicated I/O module. If there is, then the process returns to 302. If not, then the process goes to 312, which is described in greater detail below.

Returning to 306, if the wiring and jumper options for the pre-existing dedicated module and the new universal I/O module don't match, then at 314 a report is generated that shows the gaps in any one of performance, channels, isolation and/or wiring between the pre-existing dedicated I/O module and the universal I/O module. The user is then at 316 giving the option of continuing with the replacement or not. If the user wants to continue, then the process goes to 312. If not, then the process ends at 318.

At 312, a wiring diagram is generated that shows wiring to the one or more universal I/O modules using existing wiring and any new wiring and/or wiring harnesses that may be needed. At 320, a software configuration file is created for the one or more universal I/O modules so that applications running on the control system can properly interface with the new one or more universal I/O modules. In one aspect, this may involve modifying configuration files 322 associated with the pre-existing dedicated I/O modules. At 324, it is determined whether addition channels and/or additional new universal I/O modules are needed to complete the transition from the pre-existing dedicated I/O modules to the universal I/O modules. If so, then the process returns to 304. If not, then the process goes to 326 where system files are updated so that the new universal I/O module data flows to and from (control system) application code 328. The process ends at 330.

Figure 4:
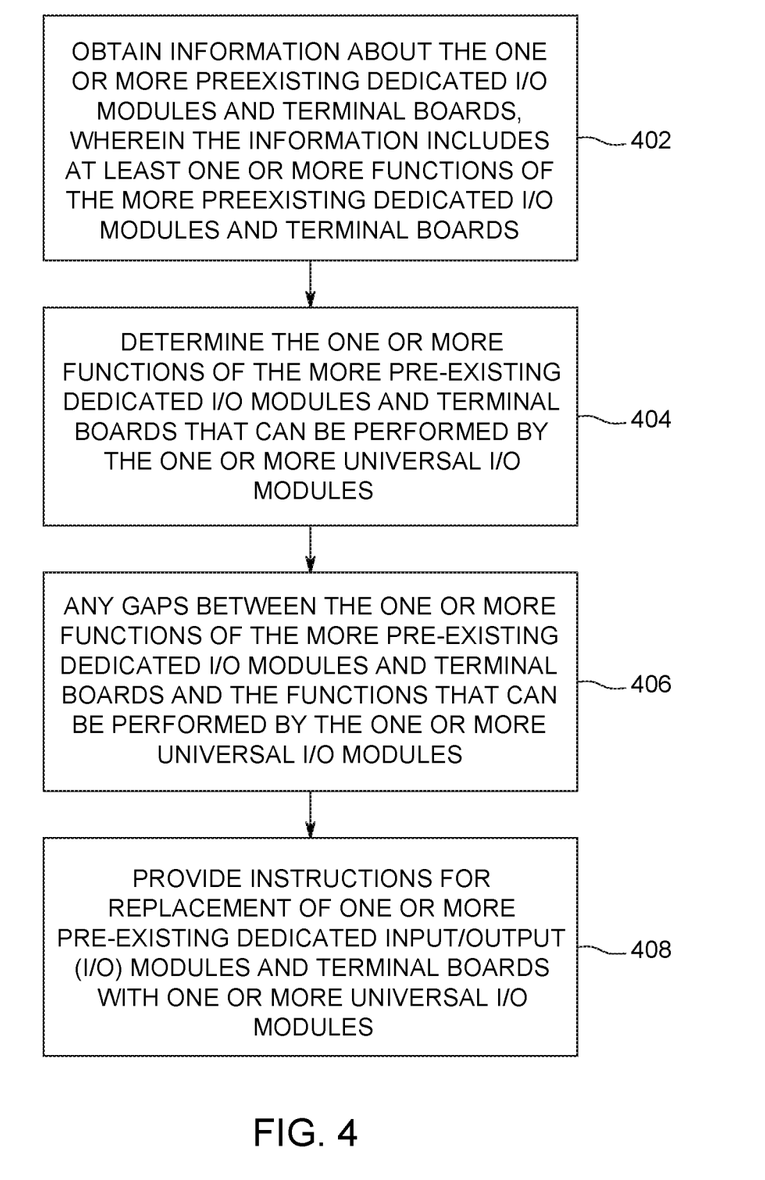
FIG. 4 is a flowchart that illustrates a method for facilitating the replacement of one or more pre-existing dedicated input/output (I/O) modules and terminal boards with one or more universal I/O modules.

FIG. 4 is a flowchart that illustrates a method for facilitating the replacement of one or more pre-existing dedicated input/output (I/O) modules and terminal boards with one or more universal I/O modules. The illustrated method comprises 402, obtaining information about the one or more pre-existing dedicated I/O modules and terminal boards, wherein the information includes at least one or more functions of the more pre-existing dedicated I/O modules and terminal boards. In one aspect, obtaining information about the one or more pre-existing dedicated I/O modules and terminal boards comprises receiving, by a computer system, the information. For example, the computer system may receive the information as information input by use of a keyboard, barcode scanner, received as image information from an image capture device, and the like. In one aspect, obtaining information about the one or more pre-existing dedicated I/O modules and terminal boards comprises performing a database lookup for the information based on receiving, by a computer system, identification information that identifies the one or more pre-existing dedicated I/O modules and terminal boards.

At 404, the one or more functions of the more pre-existing dedicated I/O modules and terminal boards that can be performed by the one or more universal I/O modules are determined. In one aspect, determining the one or more functions of the more pre-existing dedicated I/O modules and terminal boards that can be performed by the one or more universal I/O modules comprises determining a number of channels of thermocouple (TC) I/O, resistance temperature detector (RTD) I/O, analog I/O, digital I/O, and communication I/O on the pre-existing dedicated input/output (I/O) modules that will be replaced by the one or more universal I/O modules.

At 406, any gaps between the one or more functions of the more pre-existing dedicated I/O modules and terminal boards and the functions that can be performed by the one or more universal I/O modules are determined. Gaps may be performance related (e.g. specification changes), lack of enough channels (requiring additional universal I/O devices), isolation (e.g. point products cannot be directly replaced with group isolated products), wiring, and the like.

At 408, instructions are provided for replacement of one or more pre-existing dedicated input/output (I/O) modules and terminal boards with one or more universal I/O modules, wherein the instructions include the gaps between the one or more functions of the more pre-existing dedicated I/O modules and terminal boards and the functions that can be performed by the one or more universal I/O modules. In one aspect, providing instructions for replacement of one or more pre-existing dedicated input/output (I/O) modules and terminal boards with one or more universal I/O modules comprises preparing a report of spare channels on the one or more universal I/O modules, creating wiring diagrams for wiring in the one or more universal I/O modules, and creating configuration files and software settings for software that interfaces with the one or more universal I/O modules. In another aspect, providing instructions for replacement of one or more pre-existing dedicated input/output (I/O) modules and terminal boards with one or more universal I/O modules comprises specifying a wiring harness, connectors and wiring instructions for connecting the existing dedicated input/output (I/O) modules with the one or more universal I/O modules with the wiring harness and one or more connectors. In one aspect, the instructions for replacement of one or more pre-existing dedicated input/output (I/O) modules and terminal boards with one or more universal I/O modules can be displayed to a user. For example, the instructions may be displayed on a portable electronic device such as a laptop computer, a smartphone display, an electronic pad, and the like.

Figure 5:
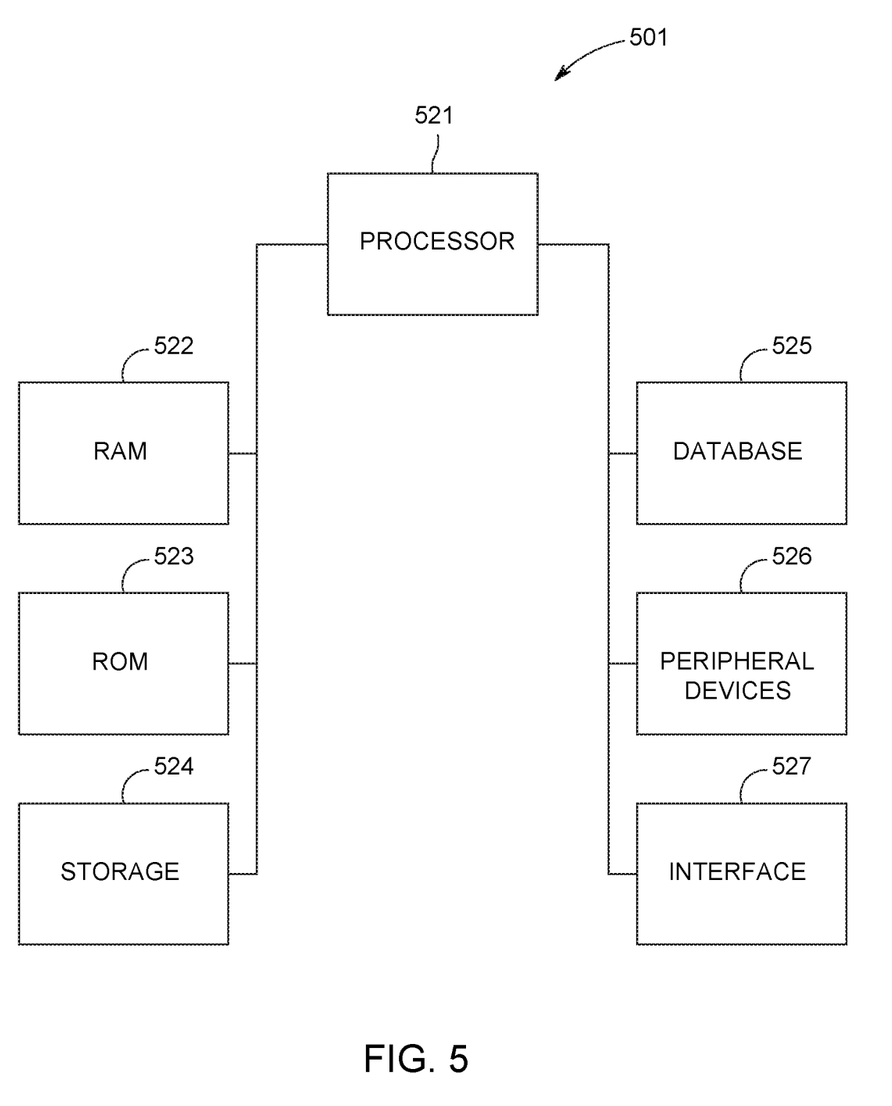
FIG. 5 is a block diagram illustrating an exemplary operating environment for performing the disclosed methods.

The system has been described above as comprised of units. One skilled in the art will appreciate that this is a functional description and that the respective functions can be performed by software, hardware, or a combination of software and hardware. A unit can be software, hardware, or a combination of software and hardware. The units can comprise software in combination with hardware to perform a method for facilitating the replacement of one or more pre-existing dedicated input/output (I/O) modules and terminal boards with one or more universal I/O modules for an industrial control system as illustrated in FIG. 5 and described below. In one exemplary aspect, the units can comprise a computer 501 as illustrated in FIG. 5, referenced above and described below.

FIG. 5 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise network PCs, minicomputers, mainframe computers, controllers, smartphones, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

FIG. 5 illustrates an exemplary computer 501 that can be used for facilitating the replacement of one or more pre-existing dedicated input/output (I/O) modules and terminal boards with one or more universal I/O modules for an industrial control system. In various aspects, the computer 501 of FIG. 5 may comprise all or a portion of the industrial control system 10, as described herein. As used herein, "computer" may include a plurality of computers. The computers may include one or more hardware components such as, for example, a processor 521, a random access memory (RAM) module 522, a read-only memory (ROM) module 523, a storage 524, a database 525, one or more peripheral devices 526, and an interface 527. Alternatively and/or additionally, computer 501 may include one or more software components such as, for example, a computer-readable medium including computer executable instructions for performing a method associated with the exemplary embodiments. It is contemplated that one or more of the hardware components listed above may be implemented using software. For example, storage 524 may include a software partition associated with one or more other hardware components. It is understood that the components listed above are exemplary only and not intended to be limiting.

Processor 521 may include one or more processors, each configured to execute instructions and process data to perform one or more functions associated with a computer for facilitating the replacement of one or more pre-existing dedicated input/output (I/O) modules and terminal boards with one or more universal I/O modules. Processor 521 may be communicatively coupled to RAM 522, ROM 523, storage 524, database 525, peripheral devices 526, and interface 527. Processor 521 may be configured to execute sequences of computer program instructions to perform various processes. The computer program instructions may be loaded into RAM 522 for execution by processor 521.

RAM 522 and ROM 523 may each include one or more devices for storing information associated with operation of processor 521. For example, ROM 523 may include a memory device configured to access and store information associated with computer 502, including information for identifying, initializing, and monitoring the operation of one or more components and subsystems. RAM 522 may include a memory device for storing data associated with one or more operations of processor 521. For example, ROM 523 may load instructions into RAM 522 for execution by processor 521.

Storage 524 may include any type of mass storage device configured to store information that processor 521 may need to perform processes consistent with the disclosed embodiments. For example, storage 524 may include one or more magnetic and/or optical disk devices, such as hard drives, CD-ROMs, DVD-ROMs, or any other type of mass media device.

Database 525 may include one or more software and/or hardware components that cooperate to store, organize, sort, filter, and/or arrange data used by computer 501 and/or processor 521. For example, database 525 may store historical data related to pre-existing dedicated I/O devices that can be accessed when determining whether to replace the dedicated I/O devices with universal I/O devices. Additionally and/or optionally, database 525 may store instructions and/or information to perform a method for facilitating the replacement of one or more pre-existing dedicated input/output (I/O) modules and terminal boards with one or more universal I/O modules comprising obtaining information about the one or more pre-existing dedicated I/O modules and terminal boards, wherein the information includes at least one or more functions of the more pre-existing dedicated I/O modules and terminal boards; determining the one or more functions of the more pre-existing dedicated I/O modules and terminal boards that can be performed by the one or more universal I/O modules; determining any gaps between the one or more functions of the more pre-existing dedicated I/O modules and terminal boards and the functions that can be performed by the one or more universal I/O modules; and providing instructions for replacement of one or more pre-existing dedicated input/output (I/O) modules and terminal boards with one or more universal I/O modules, wherein the instructions include the gaps between the one or more functions of the more pre-existing dedicated I/O modules and terminal boards and the functions that can be performed by the one or more universal I/O modules. It is contemplated that database 525 may store additional and/or different information than that listed above.

Peripheral devices 526 may include one or more components configured to communicate information with a user associated with computer 501. For example, peripheral devices 526 may include a console with an integrated keyboard and mouse to allow a user to enter information about a pre-existing dedicated I/O device. Peripheral devices 526 may also include a display including a graphical user interface (GUI) for outputting information on a monitor. Peripheral devices 526 may also include devices such as, for example, a printer for printing information associated with controller 520, a user-accessible disk drive (e.g., a USB port, a floppy, CD-ROM, or DVD-ROM drive, etc.) to allow a user to input data stored on a portable media device, a microphone, a speaker system, an image capture device (e.g. camera), or any other suitable type of interface device.

Interface 527 may include one or more components configured to transmit and receive data via a communication network, such as the Internet, Ethernet, a local area network, a wide-area network, a workstation peer-to-peer network, a direct link network, a wireless network, or any other suitable communication platform. For example, interface 527 may include one or more modulators, demodulators, multiplexers, demultiplexers, network communication devices, wireless devices, antennas, modems, and any other type of device configured to enable data communication via a communication network.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method for facilitating the replacement of pre-existing dedicated input/output (I/O) modules with universal I/O modules, wherein the method is implemented using a computer system including a processor and a memory, the method comprising:
    obtaining information about one or more pre-existing dedicated I/O modules, wherein the information includes a plurality of functions of the one or more pre-existing dedicated I/O modules;
    determining one or more functions of the one or more pre-existing dedicated I/O modules that can be performed by one or more universal I/O modules;
    determining, prior to installation of the one or more universal I/O modules, any gaps between the plurality of functions of the one or more pre-existing dedicated I/O modules and the one or more functions that can be performed by the one or more universal I/O modules;
    providing instructions for replacement of the one or more pre-existing dedicated I/O modules with the one or more universal I/O modules, wherein the instructions include the gaps between the plurality of functions of the one or more pre-existing dedicated I/O modules and the one or more functions that can be performed by the one or more universal I/O modules; and
    generating a wiring diagram showing wiring to the one or more universal I/O modules using existing wiring in the one or more pre-existing dedicated I/O modules and at least one of a new wiring and a new wiring harness.

2. The method of claim 1, wherein the computer system receives the information as information input by use of a keyboard, barcode scanner, or received as image information from an image capture device.

3. The method of claim 1, wherein obtaining information about the one or more pre-existing dedicated I/O modules further comprises performing a database lookup for the information based on receiving, by the computer system, identification information that identifies the one or more pre-existing dedicated I/O modules.

4. The method of claim 1, wherein the one or more pre-existing dedicated I/O modules comprise one or more thermocouple (TC) modules, resistance temperature detector (RTD) modules, analog I/O modules, digital I/O modules, and communication modules.

5. The method of claim 1, wherein determining the one or more functions of the one or more pre-existing dedicated I/O modules that can be performed by the one or more universal I/O modules further comprises determining a number of channels of thermocouple (TC) I/O, resistance temperature detector (RTD) I/O, analog I/O, digital I/O, and communication I/O on the one or more pre-existing dedicated I/O modules that will be replaced by the one or more universal I/O modules.

6. The method of claim 1, wherein providing instructions for replacement of the one or more pre-existing dedicated I/O modules with the one or more universal I/O modules further comprises preparing a report of spare channels on the one or more universal I/O modules, creating wiring diagrams for wiring in the one or more universal I/O modules, and creating configuration files and software settings for software that interfaces with the one or more universal I/O modules.

7. The method of claim 1, wherein providing instructions for replacement of the one or more pre-existing dedicated I/O modules with the one or more universal I/O modules further comprises specifying a wiring harness, connectors and wiring instructions for connecting the pre-existing dedicated I/O modules with the one or more universal I/O modules with the wiring harness and one or more connectors.

8. The method of claim 1, further comprising displaying the instructions for replacement of the one or more pre-existing dedicated I/O modules with the one or more universal I/O modules.

9. A method for facilitating the replacement of pre-existing dedicated input/output (I/O) modules with universal I/O modules, wherein the method is implemented using a computer system including a processor and a memory, the method comprising:
    obtaining information about one or more pre-existing dedicated I/O modules, wherein the information includes a plurality of functions of the one or more pre-existing dedicated I/O modules;
    determining one or more functions of the one or more pre-existing dedicated I/O modules that can be performed by the one or more universal I/O modules; and
    if the plurality of functions of the one or more pre-existing dedicated I/O modules can be performed by the one or more universal I/O modules, then either:

a. preparing a report of spare channels on the one or more universal I/O modules, creating wiring diagrams for wiring in the one or more universal I/O modules, and creating configuration files and software settings for software that interfaces with the one or more universal I/O modules; or b. specifying a wiring harness, connectors and wiring instructions for connecting the one or more pre-existing dedicated I/O modules with the one or more universal I/O modules with the wiring harness and one or more connectors; else if at least one function of the plurality of functions of the one or more pre-existing dedicated I/O modules cannot be performed by the one or more universal I/O modules, then:

a. determining, prior to installation of the one or more universal I/O modules, any gaps between the plurality of functions of the one or more pre-existing dedicated I/O modules and the one or more functions that can be performed by the one or more universal I/O modules; and b. preparing a report of spare channels on the one or more universal I/O modules, creating wiring diagrams for wiring in the one or more universal I/O modules, and creating configuration files and software settings for software that interfaces with the one or more universal I/O modules, wherein the report identifies the gaps.

10. The method of claim 9, wherein the computer system receives the information as information input by use of a keyboard, barcode scanner, or received as image information from an image capture device.

11. The method of claim 9, wherein obtaining information about the one or more pre-existing dedicated I/O modules further comprises performing a database lookup for the information based on receiving, by the computer system, identification information that identifies the one or more pre-existing dedicated I/O modules.

12. The method of claim 9, wherein the one or more pre-existing dedicated I/O modules comprise one or more thermocouple (TC) modules, resistance temperature detector (RTD) modules, analog I/O modules, digital I/O modules, and communication modules.

13. The method of claim 9, wherein determining the one or more functions of the one or more pre-existing dedicated I/O modules that can be performed by the one or more universal I/O modules further comprises determining a number of channels of thermocouple (TC) I/O, resistance temperature detector (RTD) I/O, analog I/O, digital I/O, and communication I/O on the one or more pre-existing dedicated I/O modules that will be replaced by the one or more universal I/O modules.

14. The method of claim 9, further comprising displaying instructions for replacement of one or more pre-existing dedicated I/O modules with one or more universal I/O modules.

15. A non-transitory computer-readable medium with computer-executable instructions thereon, the computer executable instructions for performing a method for facilitating the replacement pre-existing dedicated input/output (I/O) modules with universal I/O modules, wherein, when executed by at least one processor in communication with at least one memory, the computer executable instructions cause the at least one processor to:

obtain information about one or more pre-existing dedicated I/O modules, wherein the information includes a plurality of functions of the one or more pre-existing dedicated I/O modules;

determine one or more functions of the one or more pre-existing dedicated I/O modules that can be performed by the one or more universal I/O modules;

determine, prior to installation of the one or more universal I/O modules, any gaps between the plurality of functions of the one or more pre-existing dedicated I/O modules and the one or more functions that can be performed by the one or more universal I/O modules;

provide instructions for replacement of the one or more pre-existing dedicated I/O modules with the one or more universal I/O modules, wherein the instructions include the gaps between the plurality of functions of the one or more pre-existing dedicated I/O modules and the one or more functions that can be performed by the one or more universal I/O modules; and generate a wiring diagram showing wiring to the one or more universal I/O modules using existing wiring in the one or more pre-existing dedicated I/O modules and at least one of a new wiring and a new wiring harness.

16. The computer-readable medium of claim 15, wherein the computer executable instructions further cause the at least one processor to determine a number of channels of thermocouple (TC) I/O, resistance temperature detector (RTD) I/O, analog I/O, digital I/O, and communication I/O on the one or more pre-existing dedicated I/O modules that will be replaced by the one or more universal I/O modules.

17. The computer-readable medium of claim 15, wherein the computer executable instructions further cause the at least one processor to prepare a report of spare channels on the one or more universal I/O modules, create wiring diagrams for wiring in the one or more universal I/O modules, and create configuration files and software settings for software that interfaces with the one or more universal I/O modules.

18. The computer-readable medium of claim 15, wherein the computer executable instructions further cause the at least one processor to specify a wiring harness, connectors and wiring instructions for connecting the pre-existing dedicated I/O modules with the one or more universal I/O modules with the wiring harness and one or more connectors.

19. The method of claim 1 further comprising:

determining, after providing instructions for replacement of the one or more pre-existing dedicated I/O modules with the one or more universal I/O modules after installation of the one or more universal I/O modules, whether additional channels and/or additional new universal I/O modules are needed to complete the transition from the pre-existing dedicated I/O modules to the universal I/O modules.

20. The method of claim 1 further comprising:

updating system files on an industrial control system to facilitate data flow between the one or more universal I/O modules to and application code of the industrial control system.

* * * * *